United States Patent
Weng et al.

(10) Patent No.: US 12,011,859 B2
(45) Date of Patent: Jun. 18, 2024

(54) MOLDING APPARATUS AND MANUFACTURING METHOD OF MOLDED SEMICONDUCTOR DEVICE

(71) Applicant: Taiwan Semiconductor Manufacturing Company, Ltd., Hsinchu (TW)

(72) Inventors: Sheng-Feng Weng, Taichung (TW); Ching-Hua Hsieh, Hsinchu (TW); Chung-Shi Liu, Hsinchu (TW); Chih-Wei Lin, Hsinchu County (TW); Sheng-Hsiang Chiu, Tainan (TW); Yao-Tong Lai, Yilan County (TW); Chia-Min Lin, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/346,850

(22) Filed: Jul. 4, 2023

(65) Prior Publication Data
US 2023/0347561 A1    Nov. 2, 2023

Related U.S. Application Data

(63) Continuation of application No. 17/876,595, filed on Jul. 29, 2022, now Pat. No. 11,731,327, which is a continuation of application No. 16/398,164, filed on Apr. 29, 2019, now Pat. No. 11,446,851.

(51) Int. Cl.
*B29C 45/03* (2006.01)
*B29C 45/00* (2006.01)
*B29C 45/14* (2006.01)
*H01L 21/56* (2006.01)

(52) U.S. Cl.
CPC .... *B29C 45/14655* (2013.01); *B29C 45/0025* (2013.01); *B29C 45/03* (2013.01); *H01L 21/565* (2013.01)

(58) Field of Classification Search
None
See application file for complete search history.

(56) References Cited

U.S. PATENT DOCUMENTS

2018/0021993 A1*   1/2018   Ho ........................ B29C 45/02
264/272.15

FOREIGN PATENT DOCUMENTS

JP            2004017629 A  *  1/2004  ......... B29C 45/1639

OTHER PUBLICATIONS

Hasegawa JP2004017629A 2004 English Translation (Year: 2004).*

* cited by examiner

*Primary Examiner* — Jacob T Minskey
*Assistant Examiner* — Adrien J Bernard
(74) *Attorney, Agent, or Firm* — JCIPRNET

(57) ABSTRACT

A molding apparatus is configured for molding a semiconductor device and includes a lower mold and an upper mold. The lower mold is configured to carry the semiconductor device. The upper mold is disposed above the lower mold for receiving the semiconductor device and includes a mold part and a dynamic part. The mold part is configured to cover the upper surface of the semiconductor device. The dynamic part is disposed around a device receiving region of the upper mold and configured to move relatively to the mold part. A molding method and a molded semiconductor device are also provided.

20 Claims, 8 Drawing Sheets

MOLDING APPARATUS AND MANUFACTURING METHOD OF MOLDED SEMICONDUCTOR DEVICE

CROSS-REFERENCE TO RELATED APPLICATION

This application is a continuation application of and claims the priority benefit of a prior application Ser. No. 17/876,595, filed on Jul. 29, 2022, which is a continuation application of and claims the priority benefit of a prior application Ser. No. 16/398,164, filed on Apr. 29, 2019. The entirety of the above-mentioned patent application is hereby incorporated by reference herein and made a part of this specification.

BACKGROUND

According to the convention semiconductor packaging technology, a plurality of semiconductor chips are disposed in an array with constant spacing and pitches on a substrate. After processes of electrical connection between the chips and the substrate, molding material are formed on top of the substrate to encapsulate the chips. Then, the molding material is cured and singulated by a dicing blade or by a laser to obtain a plurality of individual semiconductor devices.

When the molding material is injected to encapsulate the chip and fill into a gap between substrate and the chip, there is a possibility of a region where the molding material is not formed, i.e., a void, being formed in the gap between the substrate and the chip. This is due to the occurrence of a difference in flow velocity of the molding material between a region where bumps electrodes (conductive terminals) exist and a region where no bump electrodes exist. The molding material flows faster downstream in a region where no bump electrodes exist, and enters a region where the bump electrodes exist in a roundabout fashion. Due to such a flow of the molding material in a roundabout fashion, a space surrounded by the molding material, i.e., a void, occurs in the vicinity of the region where the bump electrodes exist.

After filling the gaps between the substrate and the chip with the molding material, a treatment for thermally setting the molding material is performed, and stress is caused in the package by thermal expansion and thermal contraction. The above-described void in the vicinity of the bump electrodes reduces the durability under thermal stress. Accordingly, there is a possibility of breakage of the bump electrodes and, hence, a reduction in reliability of the semiconductor package.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
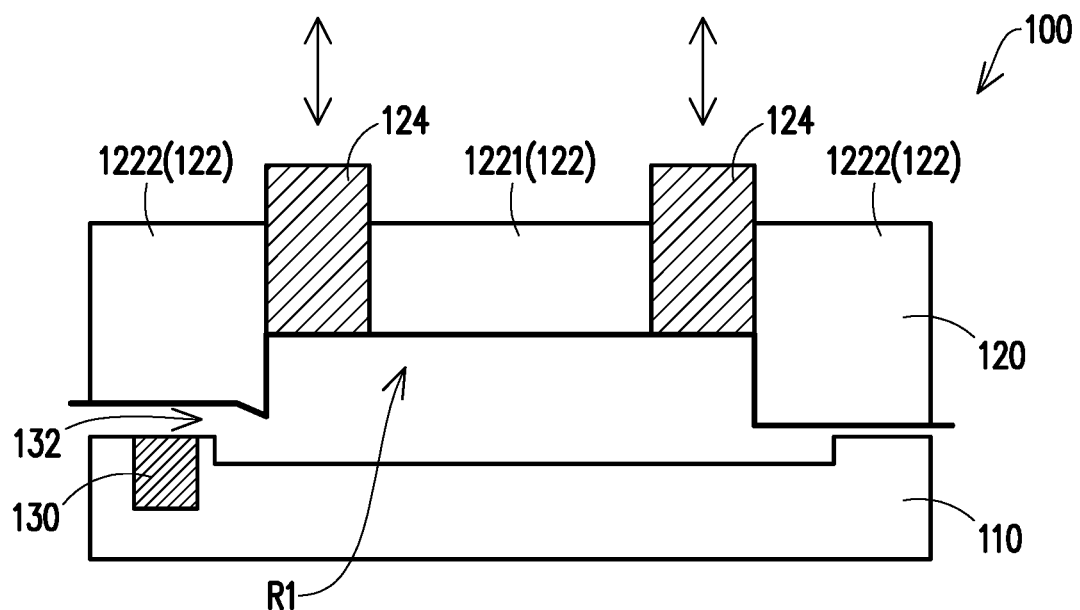
FIG. 1 illustrates a cross sectional view of a molding apparatus according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure which are now described in detail provide a molding apparatus, a manufacturing method of a molded semiconductor device utilizing the molding apparatus and a molded semiconductor device formed by the manufacturing method for providing a molding material encapsulating a semiconductor device without voids occurs in the gap between the semiconductor device and the substrate. A release film may be used to make release of the finished devices easier. In an embodiment, a dynamic part configured to move relatively to the upper mold is used to provide accurate control of flow of the molding material. Voids in the molding material between the dice and the substrate observed in the prior known approaches are reduced or eliminated. The method embodiments are implemented without substantial changes to the molding material, the substrate or the semiconductor device (integrated circuit dies).

Figure 2:
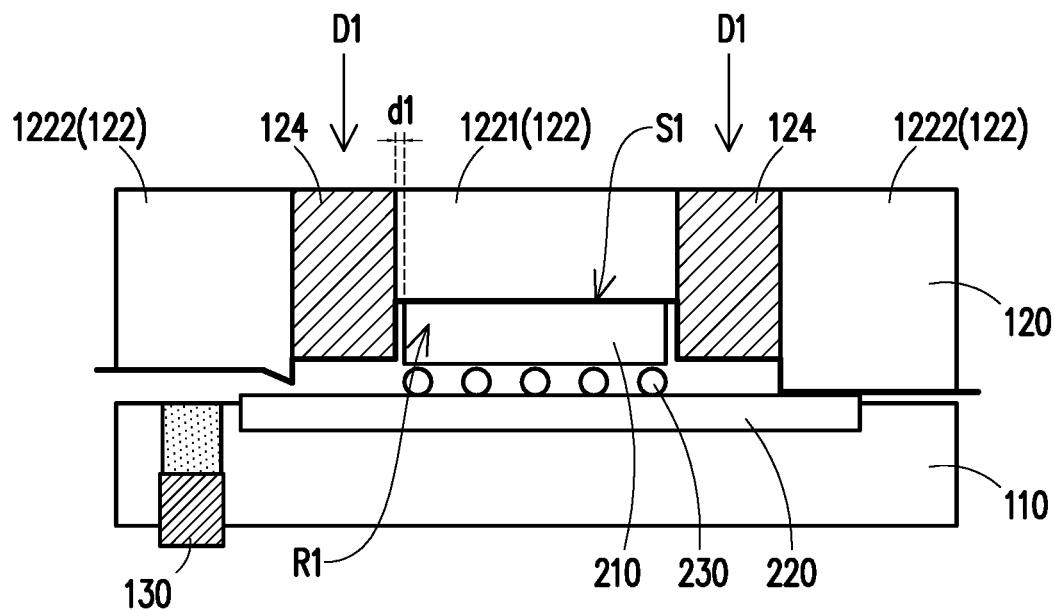
FIG. 2 to FIG. 4 illustrate cross sectional views of intermediate stages in a manufacturing of a molded semiconductor device according to some exemplary embodiments of the present disclosure.
Figure 3:
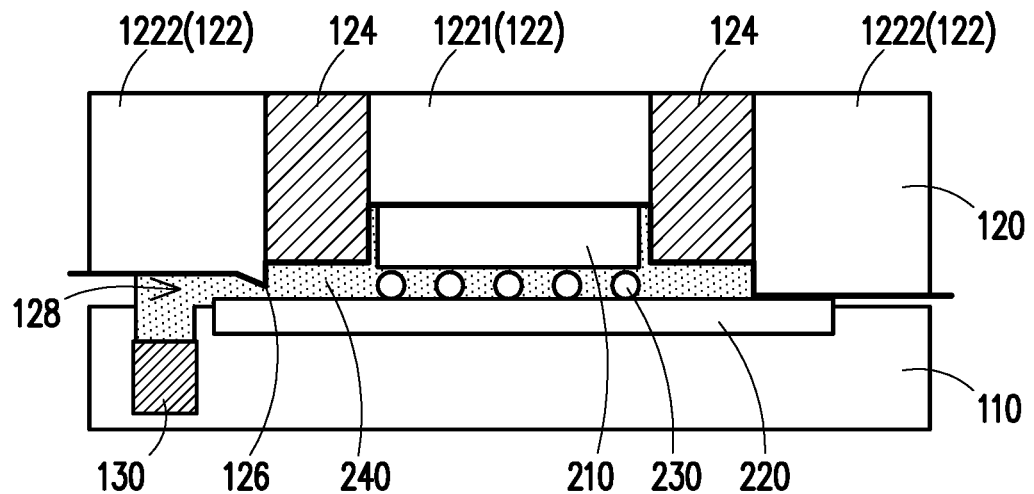
Figure 4:
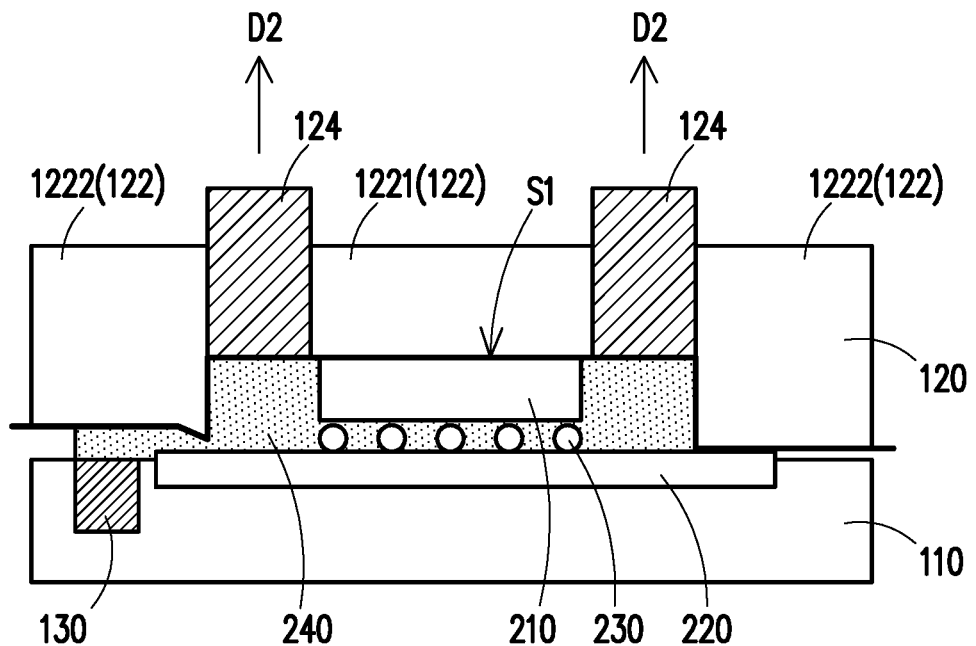

FIG. 1 illustrates a cross sectional view of a molding apparatus according to some exemplary embodiments of the present disclosure. FIG. 2 to FIG. 4 illustrate cross sectional views of intermediate stages in a manufacturing of a molded semiconductor device according to some exemplary embodiments of the present disclosure. With now reference to FIG. 1 and FIG. 2, in some embodiments, a manufacturing method of a molded semiconductor device may include the following steps. First of all, mounting a semiconductor device 210, illustrated in FIG. 2, for example, on a substrate 220. In accordance with some embodiments of the disclosure, the semiconductor device 210 may be, but not limited to, an integrated circuit dies. In some embodiments, the semiconductor device 210 may be logic device dies including logic circuits therein. In some exemplary embodiments, the semiconductor device 210 are dies that are designed for mobile applications, and may include a Power Management Integrated Circuit (PMIC) die and a Transceiver (TRX) die, for example. Although one semiconductor device 210 are illustrated, more semiconductor device 210 may be placed over the substrate 220 and level with one another.

In some embodiments, the semiconductor device 210 may be mounted on a substrate 220 through, for example, a plurality of conductive terminals 230. In some embodiments, the substrate 220 may be, in one non-limiting example, a semiconductor wafer, or a portion of a wafer. The wafer may be silicon, gallium arsenide, silicon on insulator ("SOI") or other similar materials. The wafer may include passive devices such as resistors, capacitors, inductors and the like, or active devices such as transistors. The semiconductor wafer substrate may, in an example embodiment, include additional integrated circuits. However, the substrate 220 may also be of other materials in alternative embodiments. For example, multiple layer circuit boards may be used. In some embodiments, the substrate 220 may be of bismaleimide triazine (BT) resin, FR4, ceramic, glass, plastic, tape, film, or other supporting materials that may carry the conductive pads or lands needed to receive the conductive terminals 230 for mounting the semiconductor device 210 through, for example, a flip chip bonding technique.

In accordance with some embodiments of the disclosure, the semiconductor device 210 shown in FIG. 2 may be arranged as a flip chip integrated circuit mounted onto the substrate 220. In flip chip mounting of the semiconductor device 210, the semiconductor device 210 receive connectors such as conductive terminals 230 on the bond pad terminals of the semiconductor device 210. In a non-limiting example, the conductive terminals 230 may be solder bumps. The solder material of the solder bumps may be lead based, or alternatively it may be lead free, such as silver, copper, or tin compositions. The conductive terminals 230 will be eutectics with a common melting point for use in a reflow process. In some embodiments, the conductive terminals 230 can be plated using electro or electroless plating techniques, or may be formed using screening or jet printing techniques. In some embodiments, the conductive terminals 230 may be also be other types such as copper or gold pillars, conductive studs, or C4 columns. The disclosure is not limited thereto. It is noted that a flip chip semiconductor device 210 mounted onto the substrate 220 is illustrated for the molding process, but the disclosure is not limited thereto. In other embodiments, the manufacturing method and the molding apparatus described herein may also applied to other packages such as integrated fan-out (InFO) packages for the molding process.

In one example embodiment, the solder bumps are used for conductive terminals 230 and the semiconductor device 210 are flipped over, aligned, and placed on the substrate 220 to place the conductive terminals 230 in contact with lands on the substrate 220. The semiconductor device 210 and the conductive terminals 230 may then be subjected to a thermal solder reflow step to cause the conductive terminals 230 to form electrical and physical connections to the substrate 220. Other methods for assembly of the embodiment of FIG. 2 may be used, however, and the embodiments are not limited by these examples.

With such arrangement, the substrate 220 and the semiconductor device 210 are now ready for a molding step to encapsulate the semiconductor device 210. Accordingly, a molding apparatus 100 illustrated in FIG. 1, for example, is provided for performing the molding step. In accordance with some embodiments of the disclosure, the molding apparatus 100 may include a lower mold 110 and an upper mold 120. In some embodiments, the lower mold 110 is configured to carry the semiconductor device 210. Specifically, the lower mold 110 is configured to carry the substrate 220 with the semiconductor device 210 mounted thereon. In some embodiments, the lower mold 110 may include a mold cavity for accommodating the substrate 220, and the mold cavity is designed according to the dimensions and numbers and arrangement of mold areas and thickness of the substrate 220. However, in other embodiments, the lower mold 110 may be a substantially flat plate for the substrate 220 to be placed thereon. The disclosure does not limit the arrangement of the lower mold 110.

In accordance with some embodiments of the disclosure, the upper mold 120 is disposed (installed) above the lower mold 110 for receiving the semiconductor device 210. The upper mold 120 and the lower mold 110 may be made of metal or other suitable material. The disclosure is not limited thereto. In some embodiments, the upper mold 120 may include a device receiving region R1 for receiving the semiconductor device 210 and molding material to be injected therein. In some embodiments, the upper mold 120 includes a mold part 122 and a dynamic part 124. The mold part 122 is configured to cover the upper surface of the semiconductor device 210. The dynamic part 124 is disposed around the device receiving region R1 of the upper mold 120 and configured to move relatively to the mold part 122 in order to control the flow direction of the molding material. In some embodiments, the mold part 122 defines the device receiving region R1 with the dynamic part 124.

In accordance with some embodiments of the disclosure, the mold part 122 includes a lid portion 1221 and a side wall portion 1222. The side wall portion 1222 surrounds the lid portion 1221 and the dynamic part 124 is disposed between the lid portion 1221 and the side wall portion 1222. The lid portion 1221, the dynamic part 124 and the side wall portion 1222 jointly define a mold cavity, which is the device receiving region R1. In some embodiments, a thickness of the lid portion 1221 is substantially smaller than a thickness of the side wall portion 1222. In some embodiments, the side wall portion 1222 may be in contact with the upper surface of the lower mold 110 during the molding process to define the device receiving region R1 for accommodating the semiconductor device 210 and molding material to be injected therein.

In accordance with some embodiments of the disclosure, the lid portion 1221 may include a contact surface S1, which is configured to cover the upper surface of the semiconductor device 210. In some embodiments, the contact surface S1 of the lid portion 1221 is configured to be in contact with the upper surface of the semiconductor device 210 during the molding process. In some embodiments, the contact surface S1 of the lid portion 1221 may be substantially higher than the upper surface of the semiconductor device 210. Namely, a gap may exist between the contact surface S1 of the lid portion 1221 and the upper surface of the semiconductor device 210, and the contact surface S1 may be in contact with the molding material to be injected into the device receiving region R1 during the molding process.

With now reference to FIG. 1 and FIG. 2, before the molding process is performed, i.e. before the molding material is injected into the device receiving region R1, the dynamic part 124 is moved relatively to the mold part 122 along a first direction D1. In some embodiments, the first direction D1 is the (downward) direction toward the lower mold 110. Accordingly, the dynamic part 124 is moved to a first position, as it is shown in FIG. 2, where a lower surface of the dynamic part 124 is substantially lower than the contact surface S1 of the mold part 122 (i.e. the lid portion 1221). In detail, the lower surface of the dynamic part 124 is substantially lower than the contact surface S1 of the lid portion 1221 and substantially higher than the lower surface of the side wall portion 1222.

In some embodiments, the lid portion 1221 covers the semiconductor device 210, and the dynamic part 124 surrounds the periphery of the device receiving region R1. With such arrangement, when the dynamic part 124 is moved to the first position shown in FIG. 2, the dynamic part 124 surrounds the side surfaces of the semiconductor device 210. That is to say, the dynamic part 124 is arranged corresponding to the area where the molding material is filled in the device receiving region R1. In some embodiments, the contact surface S1 of the lid portion 1221, which is in contact with the upper surface of the semiconductor device 210, is substantially larger than the upper surface of the semiconductor device 210 for tolerance (avoid damaging the semiconductor device 210). In some embodiments, a distance d1 is maintained between boundaries of the contact surface S1 of the lid portion 1221 and the upper surface of the semiconductor device 210. For example, the distance d1 may range from 200 μm to 2000 μm.

With now reference to FIG. 3, in some embodiments, the molding process may now be performed. In accordance with some embodiments of the disclosure, the molding apparatus 100 may further include an injection port 130, which may be disposed at the lower mold 110 for injecting a molding material 240 into the device receiving region R1, but the disclosure is not limited thereto. For example, the injection port 130 may be disposed at the lower mold 110 and/or the upper mold 120 for injecting the molding material 240 into the device receiving region R1. In some embodiments, the molding material 240 may include a molding compound, an epoxy, or a resin, etc., but the disclosure is not limited thereto. In some embodiments, the upper mold 120 (e.g. the side wall portion 1222) may include an injection channel 128 and an injection inlet 126. The injection channel 128 is in fluid communication with the injection port 130 for the molding material 240 provided by the injection port 130 to flow through. The injection channel 128 is connected to the injection inlet 126, such that the molding material 240 in the injection channel 128 may be injected into the device receiving region R1 through the injection inlet 126 for encapsulating the semiconductor device 210.

Generally speaking, the space between the semiconductor device 210 and the substrate 220 is rather confining. Also, it is hard for the molding material 240 to fully fill in due to a difference in flow velocity of the molding material 240 between a region where conductive terminals 230 exist and a region where no conductive terminals 230 exist, so the voids may occur. During the heating and cooling processes of molding process, solid or paste molding material 240 were melted and cured during curing processes. As such, voids in the cured molding material 240 would reduce mechanical strengths of the products or product weights specified by customers. Moreover, when voids formed in the molding material 240, delamination or pop corn easily occurs between the semiconductor device 210 and substrate 220 during thermal cycles leading to product reliability issues. Accordingly, the molding material 240 is needed to fully fill between the surfaces of the semiconductor device 210 and the surface of substrate 220 without any voids formed therein.

Therefore, in some embodiments, the dynamic part 124 is moved relatively to the mold part 122 to the first position where the lower surface of the dynamic part 124 is substantially lower than the contact surface S1 of the lid portion 1221 before the molding material is injected into the device receiving region R1. Thereby, the molding material 240 injected via the injection inlet 126 would be forced to flow into the space between the semiconductor device 210 and the substrate 220. In other words, with such arrangement, the molding material 240 is forced to firstly fill the lower part of the device receiving region R1. It is noted that the lower part of the device receiving region R1 is the cavity defined by the lid portion 1221, the side wall portion 1222 and the dynamic part 124 at the first position as it is illustrated in FIG. 3. Accordingly, the molding material 240 would not firstly flow to elsewhere more spacious, such as the space around side surfaces of the semiconductor device 210, and leave voids in the confining space between the semiconductor device 210 and the substrate 220.

With now reference to FIG. 3 and FIG. 4, in some embodiments, after the molding material 240 fully fills the lower part of the device receiving region R1, the dynamic part 124 is moved relatively to the mold part 122 along a second direction D2, which is opposite to the first direction D1. Accordingly, the dynamic part 124 is moved to a second position, as it is shown in FIG. 4, where the lower surface of the dynamic part 124 is substantially coplanar with the contact surface S1 of the lid portion 1221. In some embodiments, the molding material 240 is injected into the device receiving region R1 while the dynamic part 124 is moved relatively to the mold part 124 along the second direction D2, so the molding material 240 can gradually fill the space around the side surfaces of the semiconductor device 210. That is to say, the molding material 240 is continuously injected into the device receiving region R1 when the dynamic part 124 is moved from the first position shown in FIG. 3 to the second position shown in FIG. 4.

In other embodiments, the injection of the molding material 240 may be performed in two separated stages. For example, the first stages is when the dynamic part 124 is moved to the first position shown in FIG. 3, the molding material 240 is injected until it is fully filled the lower part of the device receiving region R1. Then, the injection of the molding material 240 stops. Then, when the dynamic part 124 is moved to the second position as it is shown in FIG. 4, the second stage of the injection of the molding material 240 begins, such that the molding material 240 can fill the rest part of the device receiving region R1.

With such arrangement, the molding apparatus 100 utilizes the dynamic part 124 configured to be moved relatively to the mold part 122 to control the flow the molding material 240 more precisely and reduce voids occurring in the molding material 240. In accordance with some embodiments of the disclosure, the dynamic part 124 is moved to the first position where the dynamic part 124 is substantially lower than the lid portion 1221 before the molding material is injected into the device receiving region R1. Thereby, the molding material 240 injected via the injection inlet 126 would be forced to firstly fill the lower part of the device receiving region R1. Accordingly, the molding material 240 would not firstly flow to elsewhere more spacious and leave voids in the confining space between the semiconductor device 210 and the substrate 220. Therefore, mechanical strengths of the molded semiconductor device (e.g., the molded semiconductor device 200 illustrated in FIG. 11) formed by the molding apparatus 100 and the manufacturing method described above can be improved. Moreover, since there is no voids formed in the molding material 240, delamination or pop corn effect between the semiconductor device 210 and substrate 220 can be avoided.

Figure 5:
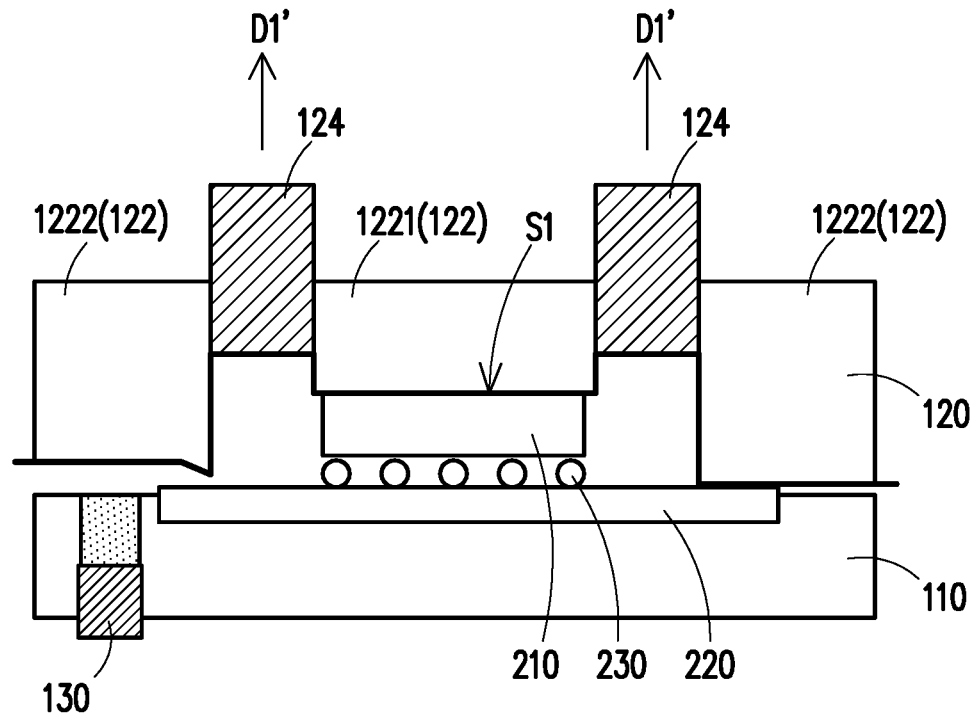
FIG. 5 to FIG. 7 illustrate cross sectional views of intermediate stages in a manufacturing of a molded semiconductor device according to some exemplary embodiments of the present disclosure.
Figure 6:
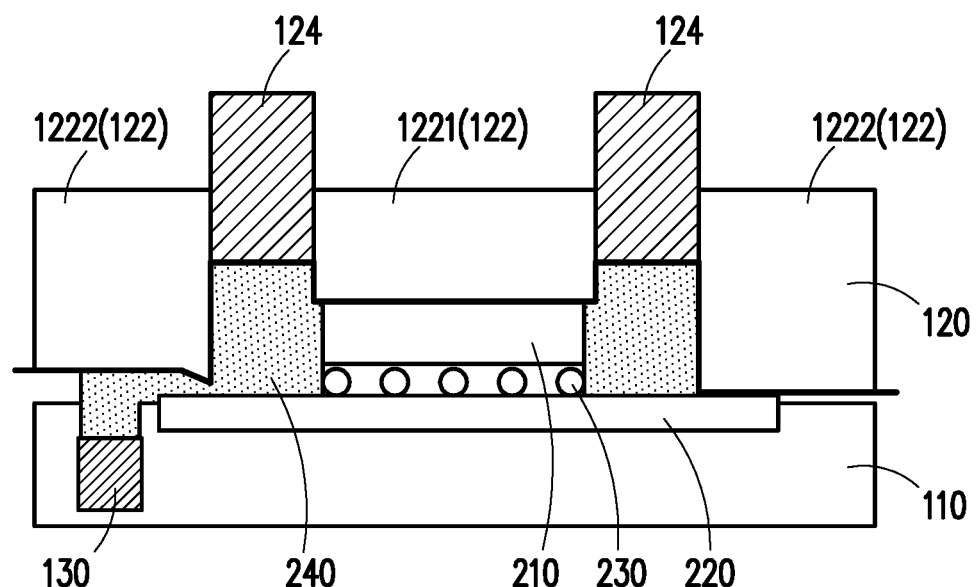
Figure 7:
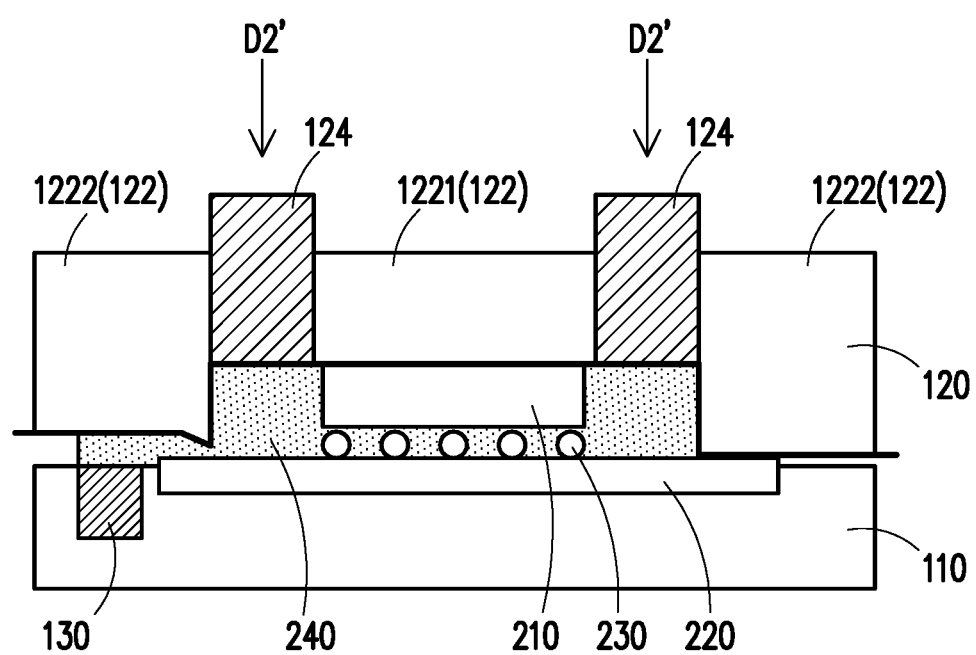

FIG. 5 to FIG. 7 illustrate cross sectional views of intermediate stages in a manufacturing of a molded semiconductor device according to some exemplary embodiments of the present disclosure. It is noted that the manufacturing method of a molded semiconductor device shown in FIG. 5 to FIG. 7 contains many features same as or similar to the manufacturing method of a molded semiconductor device disclosed earlier with FIG. 2 and FIG. 4. For purpose of clarity and simplicity, detail description of same or similar features may be omitted, and the same or similar reference numbers denote the same or like components. The main differences between the manufacturing method of the molded semiconductor device shown in FIG. 5 to FIG. 7 and the manufacturing method of the molded semiconductor device disclosed earlier with FIG. 2 and FIG. 4 are described as follows.

With now reference to FIG. 5, in some embodiments, before the molding material 240 is injected into the device receiving region R1, the dynamic part 124 is moved relatively to the mold part 122 along a first direction D1'. In some embodiments, the first direction D1 is the (upward) direction moving away from the lower mold 110. Accordingly, the dynamic part 124 is moved to a first position, as it is shown in FIG. 5, where a lower surface of the dynamic part 124 is substantially higher than a lower surface of the mold part 122 (i.e. the lid portion 1221). In detail, the lower surface of the dynamic part 124 is substantially higher than the contact surface S1 of the lid portion 1221.

With now reference to FIG. 3, in some embodiments, the molding process may now be performed. In accordance with some embodiments of the disclosure, the molding apparatus 100 may further include an injection port 130, which may be disposed at the lower mold 110 and/or the upper mold 120 for injecting a molding material 240 into the device receiving region R1. In some embodiments, the molding material 240 may include a molding compound, an epoxy, or a resin, etc., but the disclosure is not limited thereto. In some embodiments, the upper mold 120 (e.g. the side wall portion 1222) may include an injection channel 128 and an injection inlet 126. The injection channel 128 is connected to the injection inlet 126, such that the molding material 240 in the injection channel 128 may be injected into the device receiving region R1 through the injection inlet 126 for encapsulating the semiconductor device 210.

In accordance with some embodiments of the disclosure, after the dynamic part 124 is moved relatively to the mold part 122 to the first position where the lower surface of the dynamic part 124 is substantially higher than the contact surface S1 of the lid portion 1221, the molding material 240 is then injected into the device receiving region R1. In some embodiments, the molding material 240 may firstly flow to somewhere more spacious, such as the space around side surfaces of the semiconductor device 210, and leave voids in the confining space between the semiconductor device 210 and the substrate 220 as it is shown in FIG. 6. The molding material 240 may continuously being injected into the device receiving region R1 until the space around side surfaces of the semiconductor device 210 is substantially filled with the molding material 240, but the disclosure does not limit the timing of when to stop injecting the molding material 240.

With now reference to FIG. 6 and FIG. 7, in some embodiments, after the molding material 240 substantially fills the space around side surfaces of the semiconductor device 210, the dynamic part 124 is moved relatively to the mold part 122 along a second direction D2', which is opposite to the first direction D1'. Accordingly, the dynamic part 124 is moved to a second position, as it is shown in FIG. 7, where the lower surface of the dynamic part 124 is substantially coplanar with the contact surface S1 of the lid portion 1221. Accordingly, the molding material 240 in the device receiving region R1 would be pressed by the dynamic part 124 and forced to flow into the space between the semiconductor device 210 and the substrate 220. In other words, with such arrangement, the molding material 240 is pushed and forced to fully fill the space between the semiconductor device 210 and the substrate 220.

In some embodiments, the molding material 240 is injected into the device receiving region R1 while the dynamic part 124 is moved relatively to the mold part 124 along the second direction D2', so the molding material 240 can gradually fill the space between the semiconductor device 210 and the substrate 220. That is to say, the molding material 240 is continuously injected into the device receiving region R1 when the dynamic part 124 is moved from the first position shown in FIG. 6 to the second position shown in FIG. 7.

In other embodiments, the molding material 240 may not be injected into the device receiving region R1 while the dynamic part 124 is moved relatively to the mold part 124 along the second direction D2'. For example, the first stages is when the dynamic part 124 is moved to the first position shown in FIG. 6, the molding material 240 is injected into the device receiving region R1. The injection of the molding material 240 may stop until the molding material 240 is substantially filled the space around the side surfaces of the semiconductor device 210 (or until the top surface of the molding material 240 contacts the lower surface of the dynamic part 124). Then, the dynamic part 124 is moved to the second position as it is shown in FIG. 7 to push the molding material 240 to fill the space between the semiconductor device 210 and the substrate 220. Then, a second stage of the injection of the molding material 240 may be optionally applied if the molding material 240 does not fully fill the device receiving region R1.

With such arrangement, the molding apparatus 100 utilizes the dynamic part 124 configured to be moved relatively to the mold part 122 to control the flow the molding material 240 more precisely and reduce voids occurring in the molding material 240. In accordance with some embodiments of the disclosure, the dynamic part 124 is moved to the first position where the dynamic part 124 is substantially higher than the lid portion 1221 before the molding material is injected into the device receiving region R1. Thereby, the molding material 240 may substantially fills the device receiving region R1 (at least the space around side surfaces of the semiconductor device 210). Then, the dynamic part 124 is moved relatively to the mold part 122 to a second position, as it is shown in FIG. 7, where the lower surface of the dynamic part 124 is substantially coplanar with the contact surface S1 of the lid portion 1221. Accordingly, the molding material 240 in the device receiving region R1 would be pushed and forced to fully fill the space between the semiconductor device 210 and the substrate 220. Therefore, mechanical strengths of the molded semiconductor device (e.g., the molded semiconductor device 200 illustrated in FIG. 11) formed by the molding apparatus 100 and the manufacturing method described above can be improved. Moreover, since there is no voids formed in the molding material 240, delamination or pop corn effect between the semiconductor device 210 and substrate 220 can be avoided.

Figure 8:
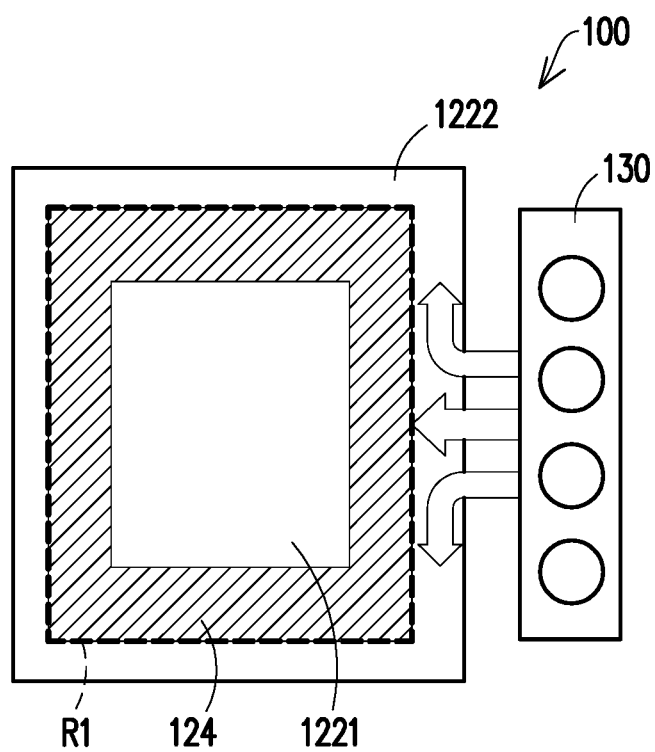
FIG. 8 illustrates a top view of a molding apparatus according to some exemplary embodiments of the present disclosure.

FIG. 8 illustrates a top view of a molding apparatus according to some exemplary embodiments of the present disclosure. With now reference to FIG. 8, in accordance with some embodiments of the disclosure, the lid portion 1221 and the side wall portion 1222 are spaced apart by the dynamic part 124a. In the present embodiment, the dynamic part 124a is arranged as a closed loop, which fully surrounds the lid portion 1221 and isolate the lid portion 1221 from the side wall portion 1222. With such arrangement, the molding material 240 is injected into the device receiving region R1 by the injection port 130 and is forced to fill the space between the semiconductor device 210 and the substrate 220 by the dynamic part 124 fully surrounding the lid portion 1221. Certainly, the exemplary embodiment herein is merely for illustration, and is not intended to limit the scope of the disclosure.

Figure 9:
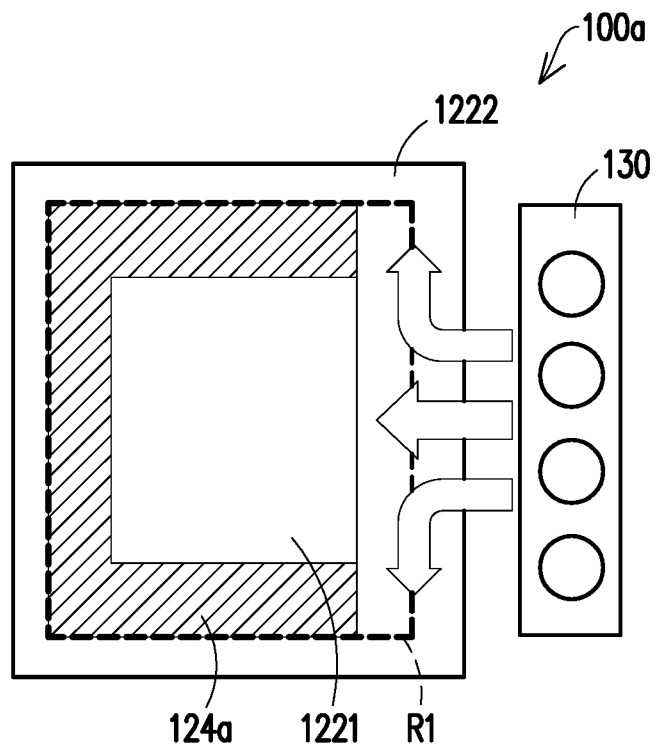
FIG. 9 illustrates a top view of a molding apparatus according to some exemplary embodiments of the present disclosure.

FIG. 9 illustrates a top view of a molding apparatus according to some exemplary embodiments of the present disclosure. It is noted that the molding apparatus 100a shown in FIG. 9 contains many features same as or similar to the molding apparatus 100 disclosed earlier with FIG. 8. For purpose of clarity and simplicity, detail description of same or similar features may be omitted, and the same or similar reference numbers denote the same or like components. The main differences between the molding apparatus 100a shown in FIG. 9 and the molding apparatus 100 disclosed earlier with FIG. 8 are described as follows.

With now reference to FIG. 9, in accordance with some embodiments of the disclosure, the dynamic part 124 partially surrounds the lid portion 1221, and the lid portion 1221 is partially connected to the side wall portion 1222. In some exemplary embodiments, the shape of the lid portion 1221 may be substantially the same as the shape of the semiconductor device (e.g. the semiconductor device 210 shown in FIG. 2). In one of the embodiments, the contact surface S1 of the lid portion 1221 and the upper surface of the semiconductor device 210 are both in rectangular shapes while the dimension of the lid portion 1221 is slightly larger than the dimension of the semiconductor device 210 to cover the upper surface of the semiconductor device 210. Accordingly, the dynamic part 124 is arranged as an open loop, which surrounds at least three sides of the rectangular lid portion 1221, and the injection port 130 is disposed at the opening of the loop (i.e. the side of the rectangular lid portion 1221 that is not surrounded by the dynamic part 124). With such arrangement, the molding material 240 is injected into the device receiving region R1 by the injection port 130 through the side not surrounded by the dynamic part 124 and is forced to fill the space between the semiconductor device 210 and the substrate 220 by the dynamic part 124 surrounding the rest of the lid portion 1221. Certainly, the exemplary embodiment herein is merely for illustration, and is not intended to limit the scope of the disclosure.

Figure 10:
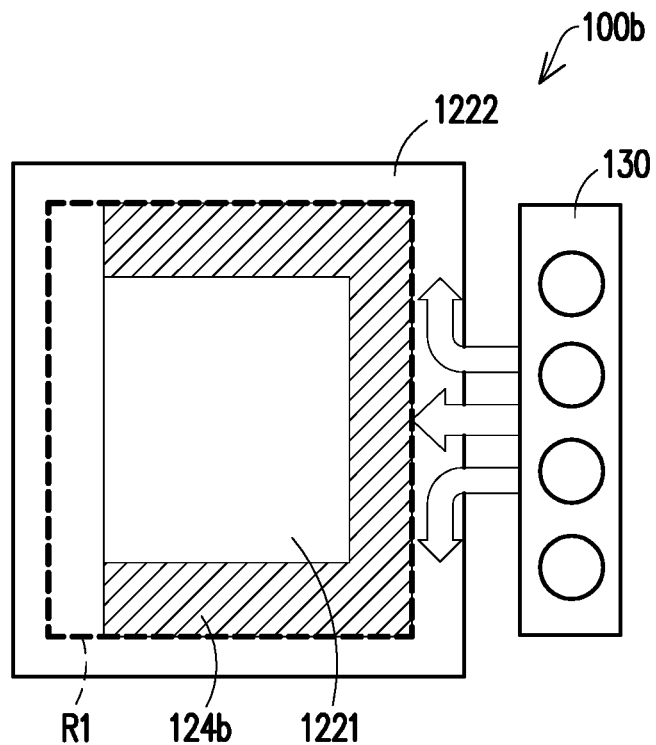
FIG. 10 illustrates a top view of a molding apparatus according to some exemplary embodiments of the present disclosure.

FIG. 10 illustrates a top view of a molding apparatus according to some exemplary embodiments of the present disclosure. It is noted that the molding apparatus 100b shown in FIG. 10 contains many features same as or similar to the molding apparatus 100 disclosed earlier with FIG. 8. For purpose of clarity and simplicity, detail description of same or similar features may be omitted, and the same or similar reference numbers denote the same or like components. The main differences between the molding apparatus 100b shown in FIG. 10 and the molding apparatus 100 disclosed earlier with FIG. 8 are described as follows.

With now reference to FIG. 10, in accordance with some embodiments of the disclosure, the dynamic part 124 partially surrounds the lid portion 1221, and the lid portion 1221 is partially connected to the side wall portion 1222. In some exemplary embodiments, the contact surface S1 of the lid portion 1221 and the upper surface of the semiconductor device 210 are both in rectangular shapes while the dimension of the lid portion 1221 is slightly larger than the dimension of the semiconductor device 210 to cover the upper surface of the semiconductor device 210. Accordingly, the dynamic part 124 is arranged as an open loop, which surrounds at least three sides of the rectangular lid portion 1221, and the injection port 130 is disposed at the side of the rectangular lid portion 1221 that is opposite to the opening of the loop. With such arrangement, the molding material 240 is injected into the device receiving region R1 by the injection port 130 and is forced to fill the space between the semiconductor device 210 and the substrate 220 by the dynamic part 124 partially surrounding the lid portion 1221. Certainly, the exemplary embodiment herein is merely for illustration, and is not intended to limit the scope of the disclosure.

Figure 11:
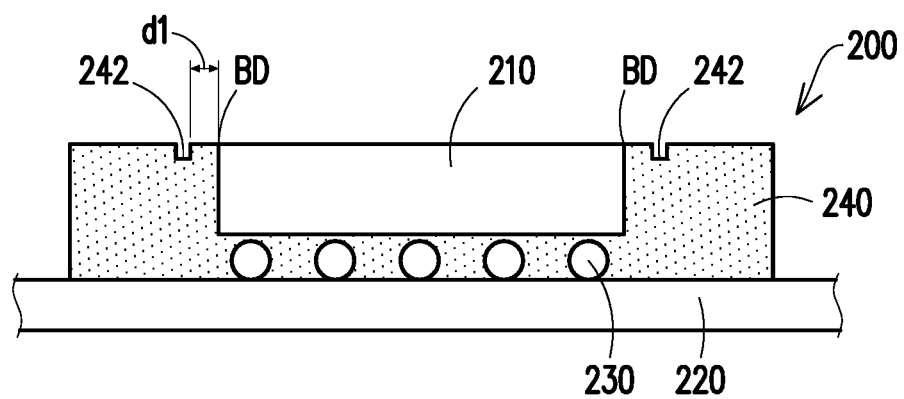
FIG. 11 illustrates a cross sectional view of a molded semiconductor device according to some exemplary embodiments of the present disclosure.
Figure 12:
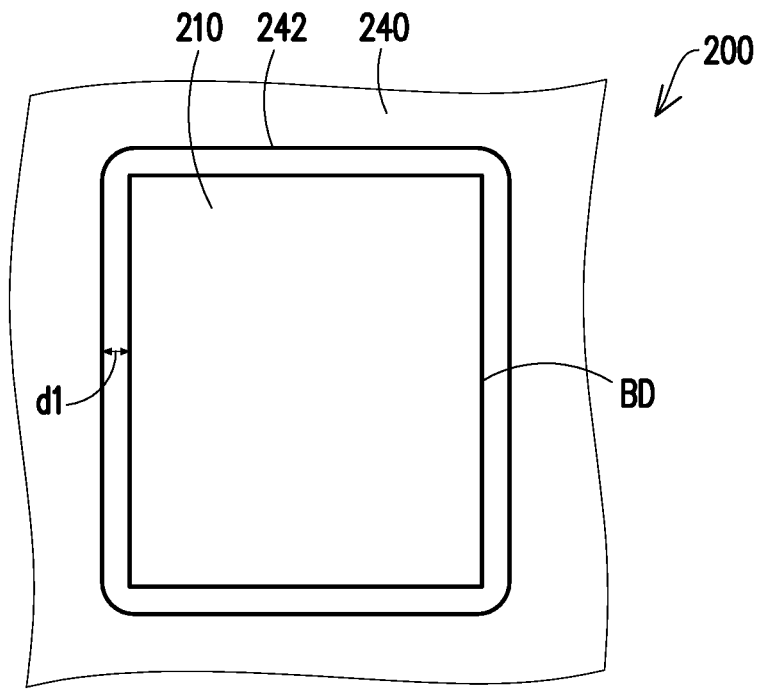
FIG. 12 illustrates a top view of a molded semiconductor device according to some exemplary embodiments of the present disclosure.

FIG. 11 illustrates a cross sectional view of a molded semiconductor device according to some exemplary embodiments of the present disclosure. FIG. 12 illustrates a top view of a molded semiconductor device according to some exemplary embodiments of the present disclosure. With now reference to FIG. 11 and FIG. 12, in accordance with some embodiments of the disclosure, the molded semiconductor device 200 manufactured by the manufacturing method and molding apparatus described above may include a semiconductor device 210 and a molding material 140. In some embodiments, the molding material 240 encapsulates the semiconductor device 210, and an upper surface of the molding material 240 is substantially coplanar with an upper surface of the semiconductor device 210. In some embodiments, the molded semiconductor device 200 may further include a substrate 220 and a plurality of conductive terminals 230. The semiconductor device 210 is mounted on the substrate 220 through the plurality of conductive terminals 230.

In accordance with some embodiments of the disclosure, the molding material 240 includes a groove 242, which at least partially surrounds the upper surface of the semiconductor device 210. With now reference to FIG. 8 and FIG. 12, in the present embodiment, the molding process of the molded semiconductor device 200 shown in FIG. 12 may be performed by the molding apparatus 100 shown in FIG. 8.

In detail, the dynamic part 124 of the molding apparatus 100 is arranged as a closed loop, which fully surrounds the lid portion 1221 and isolate the lid portion 1221 from the side wall portion 1222. In some embodiments, the contact surface S1 of the lid portion 1221 is substantially larger than the upper surface of the semiconductor device 210 for tolerance (avoid damaging the semiconductor device 210). As such, the boundaries between the lip portion 1221 and the dynamic part 124 would leave a mark (i.e. the groove 242) on the molding material 240 during the molding process. Accordingly, the molded semiconductor device 200 formed by such molding apparatus 100 shown in FIG. 8 includes the groove 242, which is a closed loop and fully surrounds the upper surface of the semiconductor device 210 as it is shown in FIG. 11 and FIG. 12. In addition, the groove 242 maintains a distance d1 from a boundary BD between the semiconductor device 210 and the molding material 240. For example, the distance d1 may range from 200 μm to 2000 μm.

It is noted that a flip chip semiconductor device 210 mounted onto the substrate 220 is illustrated herein, but the disclosure is not limited thereto. In other embodiments, other packages, such as integrated fan-out (InFO) packages, that are suitable for adapting the manufacturing method and a molding apparatus described above may also have the same or similar structural characteristics (e.g. the groove 242 at least partially surrounding the upper surface of the semiconductor device 210).

Figure 13:
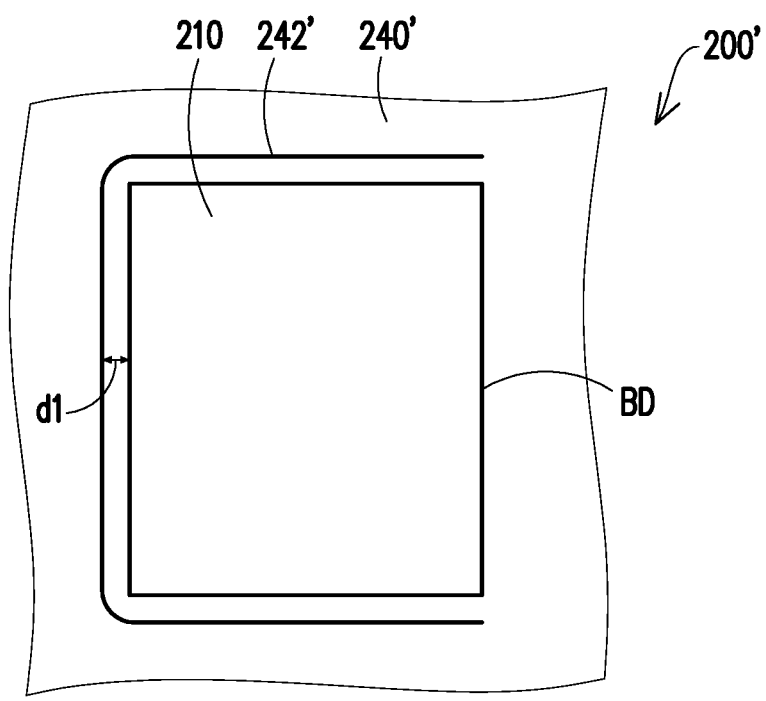
FIG. 13 illustrates a top view of a molded semiconductor device according to some exemplary embodiments of the present disclosure.

FIG. 13 illustrates a top view of a molded semiconductor device according to some exemplary embodiments of the present disclosure. It is noted that the molded semiconductor device 200' shown in FIG. 13 contains many features same as or similar to the molded semiconductor device 200 disclosed earlier with FIG. 12. For purpose of clarity and simplicity, detail description of same or similar features may be omitted, and the same or similar reference numbers denote the same or like components. The main differences between the molded semiconductor device 200' shown in FIG. 13 and the molded semiconductor device 200 disclosed earlier with FIG. 12 are described as follows.

In accordance with some embodiments of the disclosure, the molding material 240' includes a groove 242', which partially surrounds the upper surface of the semiconductor device 210. With now reference to FIG. 9 and FIG. 13, in the present embodiment, the molding process of the molded semiconductor device 200' shown in FIG. 13 may be performed by the molding apparatus 100a shown in FIG. 9. In detail, the dynamic part 124a of the molding apparatus 100a is arranged as an open loop, which partially surrounds the lid portion 1221. In some embodiments, the contact surface S1 of the lid portion 1221 is substantially larger than the upper surface of the semiconductor device 210 for tolerance (avoid damaging the semiconductor device 210). As such, the boundaries between the lip portion 1221 and the dynamic part 124a would leave a mark (i.e. the groove 242') on the molding material 240' during the molding process. Accordingly, the molded semiconductor device 200' formed by such molding apparatus 100a shown in FIG. 9 includes the groove 242', which is an open loop and partially surrounds the upper surface of the semiconductor device 210 as it is shown in FIG. 13. In addition, the groove 242' maintains a distance d1 from a boundary BD between the semiconductor device 210 and the molding material 240. For example, the distance d1 may range from 200 μm to 2000 μm. Certainly, the groove may be vary according to the configuration of the dynamic part. The disclosure is not limited thereto.

Based on the above discussions, it can be seen that the present disclosure offers various advantages. It is understood, however, that not all advantages are necessarily discussed herein, and other embodiments may offer different advantages, and that no particular advantage is required for all embodiments.

In accordance with some embodiments of the disclosure, a molding apparatus is configured for molding a semiconductor device and includes a lower mold and an upper mold. The lower mold is configured to carry the semiconductor device. The upper mold is disposed above the lower mold for receiving the semiconductor device and includes a mold part and a dynamic part. The mold part is configured to be in contact with the upper surface of the semiconductor device. The dynamic part is disposed around a device receiving region of the upper mold and configured to move relatively to the mold part.

In accordance with some embodiments of the disclosure, a manufacturing method of a molded semiconductor device includes the following steps. A semiconductor device is mounted on a substrate. A lower mold is provided for carrying the semiconductor device mounted on the substrate. An upper mold is provided over the lower mold. The upper mold includes a mold part covering an upper surface of the semiconductor device and a dynamic part disposed around a device receiving region of the upper mold. A dynamic part is moved relatively to the mold part along a first direction. A molding material is injected into the device receiving region for encapsulating the semiconductor device. The dynamic part is moved relatively to the mold part along a second direction opposite to the first direction.

In accordance with some embodiments of the disclosure, a molded semiconductor device includes a semiconductor device and a molding material. The molding material encapsulates the semiconductor device, wherein an upper surface of the molding material is substantially coplanar with an upper surface of the semiconductor device and includes a groove at least partially surrounding the upper surface of the semiconductor device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A molding apparatus for molding a semiconductor device, comprising:
    a lower mold configured to carry the semiconductor device; and
    an upper mold disposed over the lower mold and comprising:
        a static part having comprising a device receiving concave for receiving and covering the semiconductor device; and
        a dynamic part at least partially surrounding the device receiving concave and configured to move relatively to the static part.

2. The molding apparatus as claimed in claim 1, wherein a contact surface of the static part for covering the upper surface of the semiconductor device is substantially larger than the upper surface of the semiconductor device.

3. The molding apparatus as claimed in claim 1, further comprises an injection port disposed at the lower mold for injecting a molding material into the device receiving concave.

4. The molding apparatus as claimed in claim 1, wherein the static part comprises a lid portion having the contact surface covering the upper surface of the semiconductor device and a side wall portion surrounding the lid portion to define the device receiving concave.

5. The molding apparatus as claimed in claim 4, wherein the dynamic part is disposed between the lid portion and the side wall portion.

6. The molding apparatus as claimed in claim 4, wherein the dynamic part encloses the lid portion, and the lid portion and the side wall portion are spaced apart by the dynamic part.

7. The molding apparatus as claimed in claim 4, wherein the dynamic part is configured as an open loop, which partially surrounds the lid portion, and the lid portion is partially connected to the side wall portion at an opening of the open loop.

8. The molding apparatus as claimed in claim 7, further comprises an injection port configured to inject a molding material into the device receiving concave, wherein the injection port is disposed at the same side as the opening of the open loop.

9. The molding apparatus as claimed in claim 7, further comprises an injection port configured to inject a molding material into the device receiving concave, wherein the injection port is disposed at a side of the lid portion opposite to the opening of the open loop.

10. The molding apparatus as claimed in claim 1, wherein the dynamic part is configured to be moved to a first position where a lower surface of the dynamic part is not coplanar with the contact surface of the static part.

11. The molding apparatus as claimed in claim 1, wherein the dynamic part is configured to be moved to a second position where a lower surface of the dynamic part is substantially coplanar with the contact surface.

12. The molding apparatus as claimed in claim 1, wherein the semiconductor device is mounted on a substrate carried by the lower mold.

13. A molding apparatus for molding a workpiece, comprising:
    a lower mold configured to carry the workpiece;
    an upper mold disposed over the lower mold and configured to cover an upper surface and side surfaces of the workpiece, wherein the upper mold comprises a groove surrounding the workpiece; and
    a dynamic part movably disposed in the groove and configured to move relatively to the upper mold.

14. The molding apparatus as claimed in claim 13, wherein the upper mold comprises a lid portion having a contact surface covering the upper surface of the workpiece and a side wall portion surrounding the lid portion to define a workpiece receiving concave.

15. The molding apparatus as claimed in claim 14, wherein a molding material starts to be injected into the workpiece receiving concave when a lower surface of the dynamic part is substantially lower than the contact surface of the lid portion.

16. The molding apparatus as claimed in claim 14, wherein a molding material starts to be injected into the workpiece receiving concave when a lower surface of the dynamic part is substantially higher than the contact surface of the lid portion.

17. A manufacturing method of a molded semiconductor device, comprising:
    mounting a semiconductor device on a substrate;
    disposing the semiconductor device mounted on the substrate in a molding apparatus, wherein the molding apparatus comprises a lower mold for carrying the substrate, an upper mold for receiving the semiconductor device and a dynamic part movably embedded in upper mold and surrounding the semiconductor device;
    moving the dynamic part relatively to the upper mold along a first direction to a first position;
    injecting a first part of a molding material into the molding apparatus while the dynamic part is at the first position;
    moving the dynamic part relatively to the upper mold along a second direction to a second position, wherein the second direction is opposite to the first direction.

18. The manufacturing method as claimed in claim 17, wherein the upper mold comprises a lid portion having a contact surface covering the upper surface of the workpiece and a side wall portion surrounding the lid portion.

19. The manufacturing method as claimed in claim 18, wherein the first position is where a lower surface of the dynamic part is substantially higher than a lower surface of the lid portion, and the second position is where a lower surface of the dynamic part is substantially coplanar with the contact surface of the lid portion.

20. The manufacturing method as claimed in claim 18, further comprising:
    injecting a second part of the molding material into the molding apparatus while the dynamic part is at the second position, wherein the first position is where a lower surface of the dynamic part is substantially lower than the contact surface of the lid portion, and the second position is where a lower surface of the dynamic part is substantially coplanar with the contact surface of the lid portion.

* * * * *